(12) United States Patent
Goktepeli et al.

(10) Patent No.: US 10,608,124 B2
(45) Date of Patent: Mar. 31, 2020

(54) BACK SILICIDED VARIABLE CAPACITOR DEVICES

(71) Applicant: QUALCOMM Incorporated, San Diego, CA (US)

(72) Inventors: Sinan Goktepeli, San Diego, CA (US); Fabio Alessio Marino, San Marcos, CA (US); Narasimhulu Kanike, San Diego, CA (US); Plamen Vassilev Kolev, San Diego, CA (US); Qingqing Liang, San Diego, CA (US); Paolo Menegoli, San Jose, CA (US); Francesco Carobolante, Carlsbad, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/957,484

(22) Filed: Apr. 19, 2018

(65) Prior Publication Data

US 2019/0326448 A1    Oct. 24, 2019

(51) Int. Cl.
*H01L 29/93* (2006.01)
*H01L 29/06* (2006.01)
*H01L 29/45* (2006.01)

(52) U.S. Cl.
CPC .......... *H01L 29/93* (2013.01); *H01L 29/0649* (2013.01); *H01L 29/456* (2013.01)

(58) Field of Classification Search
CPC .... H01L 29/93; H01L 29/0649; H01L 29/456

USPC .......................................................... 257/596
See application file for complete search history.

(56) References Cited

U.S. PATENT DOCUMENTS

| 7,622,357 | B2 | 11/2009 | Vaed et al. |
| 8,498,094 | B2 | 7/2013 | Marino et al. |
| 8,501,515 | B1* | 8/2013 | Pan .......................... H03H 3/02 257/E27.006 |
| 8,809,155 | B2 | 8/2014 | Ellis-Monaghan et al. |
| 9,660,110 | B2 | 5/2017 | Kim et al. |
| 9,721,946 | B2 | 8/2017 | Kim et al. |
| 2007/0275533 | A1* | 11/2007 | Vaed ................. H01L 21/76898 438/329 |
| 2008/0237677 | A1* | 10/2008 | Futatsugi .......... H01L 29/66075 257/312 |
| 2015/0171073 | A1* | 6/2015 | Hu ....................... H01L 27/0288 257/363 |
| 2016/0372582 | A1* | 12/2016 | Camillo-Castillo ........................ H01L 29/0821 |

* cited by examiner

*Primary Examiner* — Calvin Y Choi
(74) *Attorney, Agent, or Firm* — Patterson & Sheridan, L.L.P.

(57) ABSTRACT

Certain aspects of the present disclosure provide a semiconductor device. One example semiconductor device generally includes a semiconductor region, an insulative layer, a first terminal, and a first non-insulative region coupled to the first terminal, the insulative layer being disposed between the first non-insulative region and the semiconductor region. In certain aspects, the insulative layer is disposed adjacent to a first side of the semiconductor region. In certain aspects, the semiconductor device also includes a second terminal, and a first silicide layer coupled to the second terminal and disposed adjacent to a second side of the semiconductor region, the first side and the second side being opposite sides of the semiconductor region.

30 Claims, 8 Drawing Sheets

BACK SILICIDED VARIABLE CAPACITOR DEVICES

TECHNICAL FIELD

Certain aspects of the present disclosure generally relate to electronic circuits and, more particularly, to semiconductor devices.

BACKGROUND

Semiconductor capacitors are fundamental components for integrated circuits. A variable capacitor is a capacitor whose capacitance may be intentionally and repeatedly changed under the influence of a bias voltage. A variable capacitor is often used in inductor-capacitor (LC) circuits to set the resonance frequency of an oscillator, or as a variable reactance, e.g., for impedance matching in antenna tuners. One example type of variable capacitor is referred to as a transcap (TC) device, which is a metal-oxide semiconductor (MOS) based variable capacitor having at least three terminals, one of which is used to modulate the capacitance across two terminals of the TC device.

A voltage-controlled oscillator (VCO) is an example circuit that may use a varactor in which the size of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure generally relate to a structure for a semiconductor device.

Certain aspects provide a semiconductor variable capacitor. The semiconductor variable capacitor generally includes a semiconductor region having a first region, a second region, and a third region, the third region being disposed between the first and second regions and having at least one of a different doping type or a different doping concentration than at least one of the first region or the second region; an insulative layer; a first terminal; a first non-insulative region coupled to the first terminal, the insulative layer being disposed between the first non-insulative region and the semiconductor region, wherein the insulative layer is disposed adjacent to a first side of the semiconductor region; a second terminal; and a first silicide layer coupled to the second terminal and disposed adjacent to a second side of the semiconductor region, the first side and the second side being opposite sides of the semiconductor region.

Certain aspects provide a semiconductor variable capacitor. The semiconductor variable capacitor generally includes a semiconductor region; an insulative layer; a first terminal; a first non-insulative region coupled to the first terminal, the insulative layer being disposed between the first non-insulative region and only a portion of the semiconductor region, wherein the insulative layer is disposed adjacent to a first side of the semiconductor region; a second terminal; and a first silicide layer coupled to the second terminal and disposed adjacent to a second side of the semiconductor region, the first side and the second side being opposite sides of the semiconductor region.

Certain aspects provide a semiconductor variable capacitor. The semiconductor variable capacitor generally includes a semiconductor region; a buried oxide (BOX) region; a first non-insulative region, the BOX region being disposed between the first non-insulative region and the semiconductor region, wherein the BOX region is disposed adjacent to a first side of the semiconductor region; and a first silicide layer disposed adjacent to the first side of the semiconductor region.

Certain aspects provide a method for fabricating a semiconductor variable capacitor. The method generally includes forming a semiconductor region having a first region, a second region, and a third region, the third region being formed between the first and second regions and having at least one of a different doping type or a different doping concentration than at least one of the first region or the second region; forming an insulative layer; forming a first non-insulative region, the insulative layer being formed between the first non-insulative region and the semiconductor region, wherein the insulative layer is formed adjacent to a first side of the semiconductor region; coupling a first terminal to the first non-insulative region; forming a first silicide layer adjacent to a second side of the semiconductor region, the first side and the second side being opposite sides of the semiconductor region; and coupling a second terminal to the first silicide layer.

Certain aspects provide a method for fabricating a semiconductor variable capacitor. The method generally includes forming a semiconductor region; forming an insulative layer; forming a first non-insulative region, the insulative layer being formed between the first non-insulative region and only a portion of the semiconductor region, wherein the insulative layer is formed adjacent to a first side of the semiconductor region; coupling a first terminal to the first non-insulative region; forming a first silicide layer adjacent to a second side of the semiconductor region, the first side and the second side being opposite sides of the semiconductor region; and coupling a second terminal to the first silicide layer.

Certain aspects provide a method for fabricating a semiconductor variable capacitor. The method generally includes forming a buried oxide (BOX) region; forming a semiconductor region; forming a first non-insulative region, the BOX region being formed between the first non-insulative region and the semiconductor region, wherein the BOX region is formed adjacent to a first side of the semiconductor region; and forming a first silicide layer adjacent to the first side of the semiconductor region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a semiconductor device structure implemented using a back silicide configuration in an effort, for example, to reduce parasitic coupling between terminals of the device.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Transcap Devices

Figure 1:
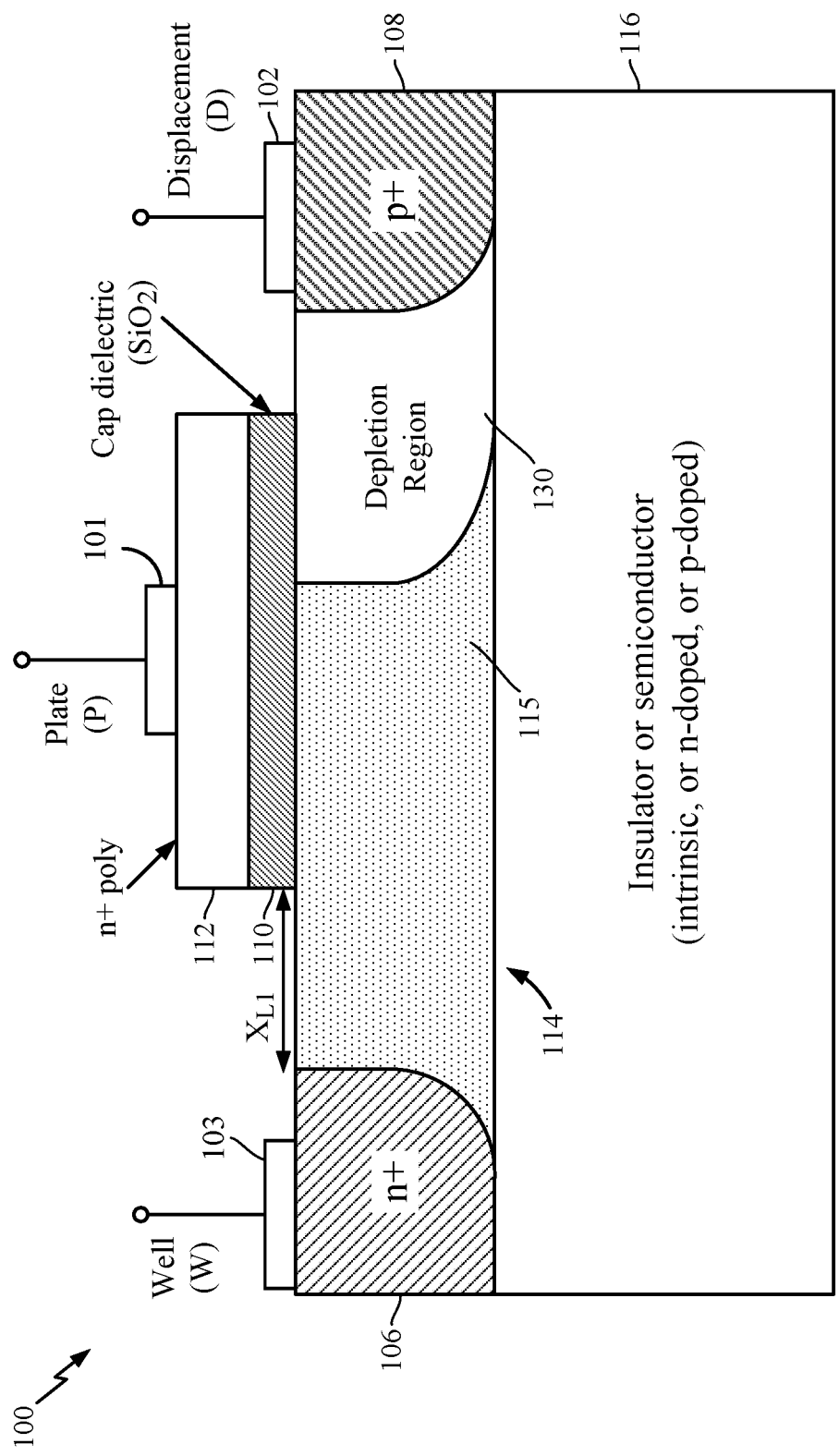
FIG. 1 illustrates a cross-sectional view of an example transcap device (TC).

FIG. 1 illustrates an example structure of a transcap (TC) device 100. The TC device 100 includes a non-insulative region 112 coupled to a plate (P) terminal 101, a non-insulative region 106 coupled to a well (W) terminal 103, and a non-insulative region 108 coupled to a displacement (D) terminal 102. Certain implementations of a TC device use a plate oxide layer 110 disposed above a semiconductor region 114. The plate oxide layer 110 may isolate the W and P terminals, and thus, in effect act as a dielectric for the TC device 100. The non-insulative region 106 (e.g., heavily n doped region) and the non-insulative region 108 (e.g., heavily p doped region) may be formed in the semiconductor region 114 and on two sides of the TC device 100 in order to create p-n junctions. As used herein, a non-insulative region generally refers to a region that may be conductive or semiconductive.

In certain aspects, a bias voltage may be applied between the D terminal 102 and the W terminal 103 in order to modulate the capacitance between the P and W terminals. For example, by applying a bias voltage to the D terminal 102, a depletion region 130 may be formed between the p-n junction of the non-insulative region 108 and the region 115 of the semiconductor region 114. Based on the bias voltage, this depletion region 130 may widen under the plate oxide layer 110, reducing the area of the equivalent electrode formed by the semiconductor region 114, and with it, the effective capacitance area and capacitance value of the TC device 100. Furthermore, the bias of the W and P terminals may be set as to avoid the formation of an inverted region underneath the oxide and operate the TC device 100 in deep depletion mode. By varying the voltage of the W terminal with respect to the P and D terminals, both vertical and horizontal depletion regions may be used to modulate the capacitance between the W and P terminals.

The work-function of the non-insulative region 112 above the plate oxide layer 110 may be chosen to improve the device performance. For example, an n-doped poly-silicon material may be used (instead of p-doped), even if the semiconductor region 114 underneath the plate oxide layer 110 is doped with n-type impurities. In some aspects, a metallic material (also doped if desired) may be used for the non-insulative region 112 with an opportune work-function or a multi-layer stack of different metallic materials to obtain the desired work-function. In certain aspects, the non-insulative region 112 may be divided into two sub-regions, one n-doped and one p-doped, or a different metallic material may be used for each sub-region.

In some cases, the semiconductor region 114 may be disposed above an insulator or region 116. The type of material for the region 116 may be chosen in order to improve the TC device 100 performance. For example, the region 116 may be an insulator, a semi-insulator, or an intrinsic/near-intrinsic semiconductor in order to decrease the parasitic capacitances associated with the TC device 100. In some cases, the region 116 may be made of n-doped or p-doped semiconductor with an appropriate doping profile in order to increase the TC device Q and/or the control on the depletion region 130 that may be formed between the non-insulative region 108 and the region 115 of the semiconductor region 114 when applying a bias voltage to the D terminal 102. The region 116 may also be formed by multiple semiconductor layers or regions doped in different ways (n, p, or intrinsic). Furthermore, the region 116 may include semiconductors, insulating layers, and/or substrates or may be formed above semiconductors, insulating layers, and/or substrates.

To better understand the working principle of the TC device 100, it may be assumed that the D terminal 102 is biased with a negative voltage with respect to the W terminal 103. The width of the depletion region 130 in the semiconductor region 114 may be controlled by applying a control voltage to the D terminal 102 or to the W terminal 103. The capacitance between the W and P terminals may depend on the width of the depletion region 130 in the semiconductor region 114, and thus, may be controlled by applying the control voltage to the D terminal 102. Furthermore, the variation of the bias voltage applied to the D terminal 102 may not alter the direct-current (DC) voltage between the W and P terminals, allowing for improved control of the device characteristics.

In some cases, it may be preferable to have the non-insulative region 106 and/or non-insulative region 108 a distance away from the plate oxide layer 110 in order to reduce the parasitic capacitance associated with the non-insulative region 108 and improve the isolation of the non-insulative region 106 for high control voltages. For example, the non-insulative region 106 may be partially overlapped with the plate oxide layer 110, or the non-insulative region 106 may be formed at a distance from the edge of the plate oxide layer 110 to increase the device tuning range and linearity. In the latter case, the voltage-withstanding capability of the device is improved since a portion of a radio-frequency (RF) signal, that may be applied to the P and W terminals, drops between the oxide edge and the non-insulative region 106 instead of being applied entirely across the plate oxide layer 110. The non-insulative region 108 may be partially overlapped with the plate oxide layer 110, or the non-insulative region 108 may be spaced apart from the plate oxide layer 110 so as to reduce the parasitic capacitance between the P terminal 101 and the D terminal 102.

In certain aspects, the semiconductor region 114 may be implemented with a p-well region to improve the breakdown voltage of the p-n junction between the non-insulative region 108 and the region 115 of the semiconductor region 114, decreasing, at the same time, the parasitic capacitance between the P terminal 101 and the D terminal 102. Similarly, the semiconductor region 114 may be implemented with an n-doped region between the non-insulative region 106 and region 115 of the semiconductor region 114 in order to regulate the doping concentration between the plate oxide layer 110 and the non-insulative region 106. In certain aspects of the present disclosure, the semiconductor region 114 may be implemented with two or more regions having different doping concentrations and/or different doping types. A junction between the two or more regions may be disposed below the plate oxide layer 110 to improve the Q of the TC device 100.

Figure 2:
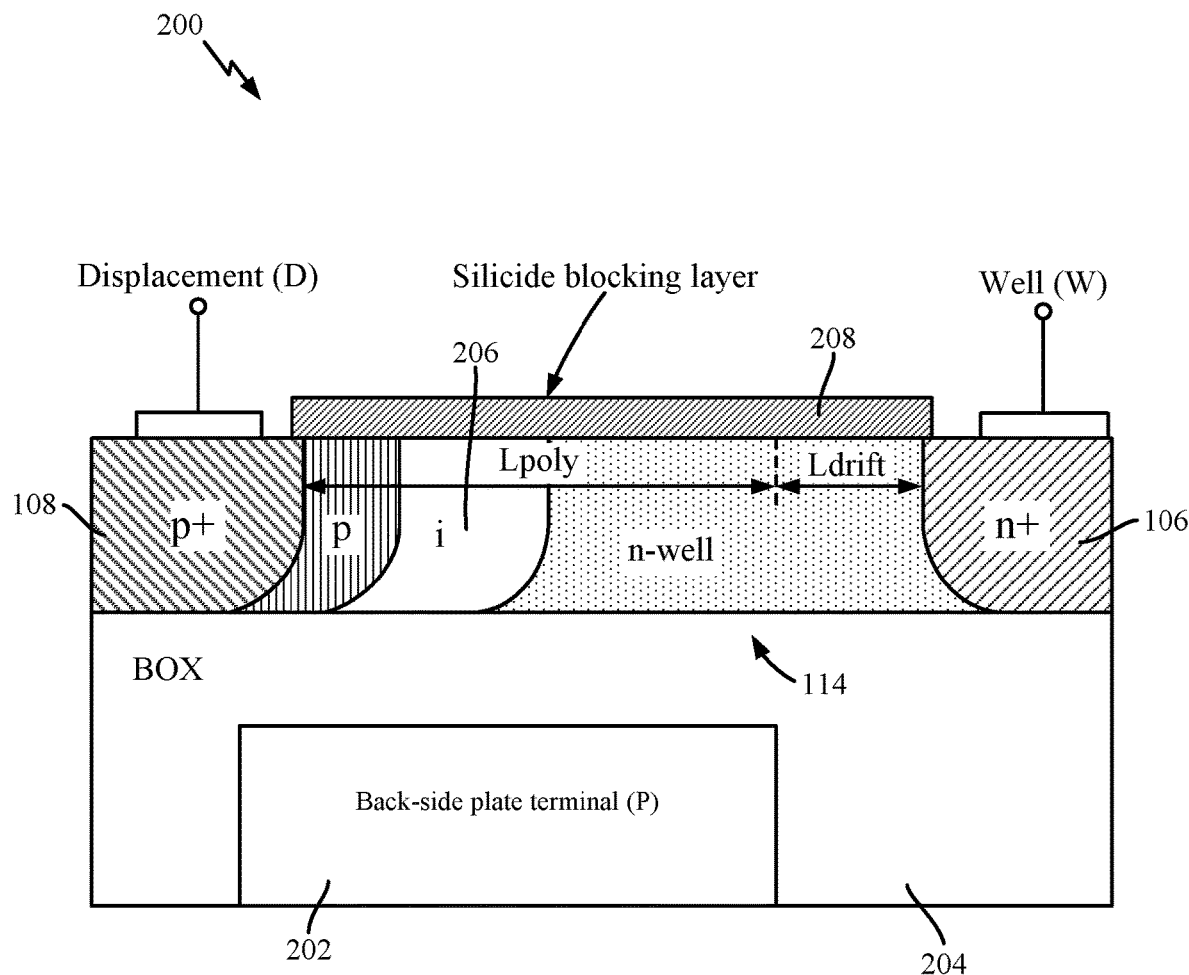
FIG. 2 illustrates an example TC device implemented using a back-gate configuration.

FIG. 2 illustrates an example TC device 200 implemented using a back-gate configuration. For example, a non-insulative region 202 (e.g., a backside P terminal) may be formed below at least a portion of a buried oxide (BOX) region 204 of the TC device 200. Therefore, the BOX region 204 may be used as the plate oxide, and a backside cavity contact may be used as a P terminal, enabling the use of the TC device 200 in high voltage applications, for example.

While reducing the maximum control voltage is not a primary objective for this TC device configuration, the tuning-range-versus-Q performance of the TC device 200 may be improved by incorporating an intrinsic region 206. The configuration of the TC device 200 allows for the fabrication of thick oxide transcaps with oxide thicknesses in the range of 30-40 nm with operating voltages up to 15 V-20 V, for example. In certain aspects, a silicide-blocking layer 208 may be formed above at least a portion of the semiconductor region 114 to prevent the junctions between the different regions of the semiconductor region 114 from being shorted.

The TC devices 100 and 200 may be fabricated on the same wafer using substrate removal silicon-on-insulator (SOI) process technologies. While the TC device of FIG. 1 may use a polysilicon or metal gate as the P terminal and has a plate oxide with an operating voltage usually in the range of 2.5 V-3.3 V, the buried-oxide-based TC device 200 exploits a metal cavity underneath the structure as a P terminal. Therefore, the TC device 200 is capable of operating at much higher voltages (e.g., up to 20 V), as previously described. In terms of device performance, thin oxide devices may have higher tuning range and higher capacitance density but lower quality factor and linearity compared to the buried oxide TC device 200, making the latter an attractive solution for tuning RF front-end applications where the voltage amplitude may reach high voltages (e.g., 20-30 V).

Example Back Silicided Variable Capacitor Devices

The performance of the TC device 100 is related to the parasitic capacitance of the metallization connecting the TC device to the other components in the circuit. For example, parasitic capacitances may exist between the W terminal 103 and the P terminal 101, and between the D terminal 102 and the P terminal 101, which degrade the performance of the TC device 100. Certain aspects of the present disclosure provide device solutions for mitigating the degradation in the device performance due to these parasitic capacitances. For example, certain aspects of the present disclosure provide techniques for reducing coupling capacitance between terminals of a TC device by manufacturing the plate metal interconnections on one side of the wafer and the well and/or displacement interconnections on the other side. For instance, a silicide layer may be formed on the bottom of the wafer, after flipping the wafer and etching away the buried oxide (BOX) dielectric, and used for the D and/or the W terminals, as described in more detail herein.

Figure 3A:
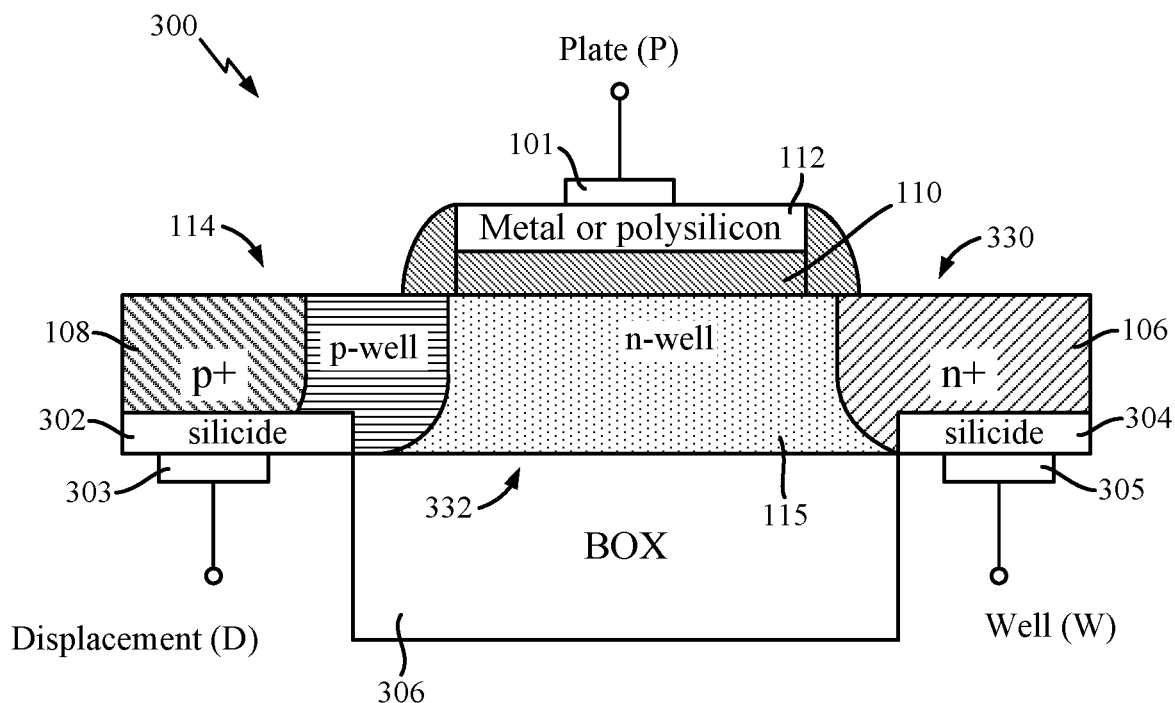
FIGS. 3A and 3B illustrate example TC devices implemented using a back silicide layer, in accordance with certain aspects of the present disclosure.
Figure 3B:
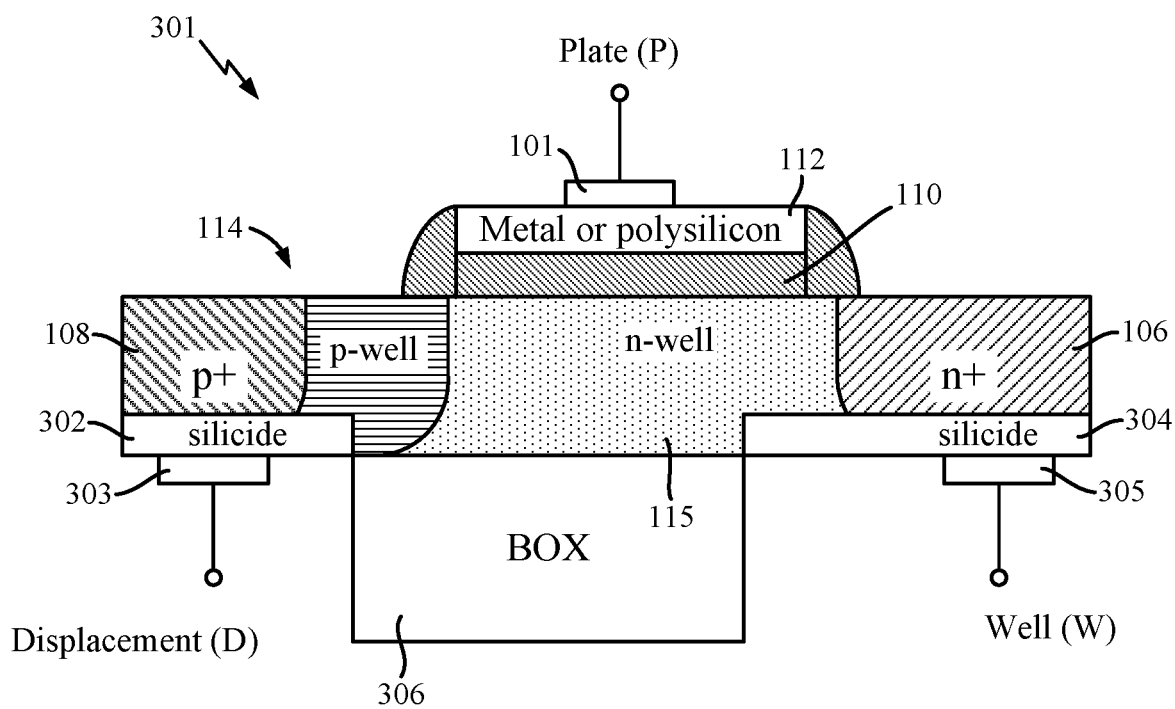

FIGS. 3A and 3B illustrate example TC devices 300 and 301 implemented using a back silicide layer, in accordance with certain aspects of the present disclosure. The non-insulative region 108 may be coupled to a silicide layer 302 for the D terminal 303. For example, the silicide layer 302 may be coupled to the D terminal 303. As illustrated, the silicide layer 302 and the plate oxide layer 110 are disposed adjacent to opposite sides of the semiconductor region 114 (e.g., a first side 330 and a second side 332). The plate oxide layer 110 and the non-insulative region 112 are fabricated using SOI technology and are disposed above only a portion of the semiconductor region 114. In certain aspects, the semiconductor region 114 may be a monocrystalline semiconductor.

In addition, the non-insulative region 106 may be coupled to a silicide layer 304 for the W terminal 305. For example, the silicide layer 304 may be coupled to the W terminal 305, as illustrated. The silicide layer 304 and the plate oxide layer 110 may be disposed adjacent to opposite sides of the semiconductor region 114. By having the D terminal 303 and W terminal 305 on an opposite side of the semiconductor region 114 as the P terminal 101, the parasitic capacitance between the P terminal 101 and each of the D terminal 303 and the W terminal 305 is decreased compared to conventional transcap devices.

As illustrated in FIG. 3A, the silicide layer 304 may be disposed adjacent to the highly doped region (non-insulative region 106). In some cases, the silicide layer 304 may be extended to also be adjacent to the low doped n-well region (e.g., region 115), as illustrated in FIG. 3B, in order to increase the quality factor of the TC device at the expense of tuning range.

In certain aspects, the BOX region 306 may be disposed between the D terminal 303 and the W terminal 305. For example, during the fabrication of the TC device 300, the wafer on which the TC device 300 is fabricated may be flipped, and the BOX region 306 may be etched to allow formation of the silicide layers 302 and 304 for the D terminal 303 and the W terminal 305, respectively.

Figure 4:
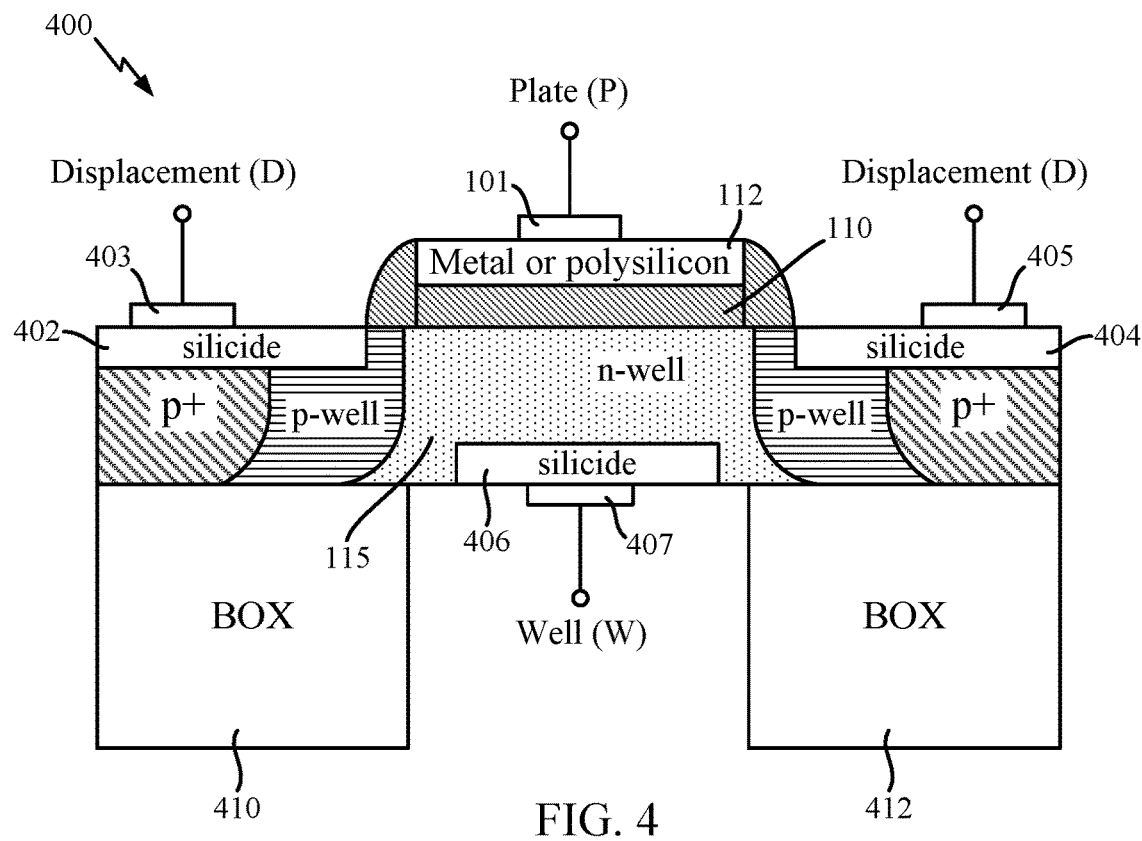
FIG. 4 illustrates an example TC device implemented using a back silicide layer for the well terminal, in accordance with certain aspects of the present disclosure.

FIG. 4 illustrates an example TC device 400 implemented using a back silicide layer for the W terminal, in accordance with certain aspects of the present disclosure. As illustrated, the silicide layers 402 and 404 are disposed adjacent to the same side of the semiconductor region 114 as the non-insulative region 112 for the P terminal 101. The silicide layers 402 and 404 are coupled to D terminals 403 and 405, respectively, as illustrated.

The TC device 400 also includes a silicide layer 406 coupled to a W terminal 407. The silicide layer 406 and the non-insulative region 112 are disposed adjacent to opposite sides of the region 115, reducing parasitic capacitance between the P terminal 101 and the W terminal 407.

As illustrated, the W terminal 407 is disposed between a BOX region 410 and a BOX region 412. For example, during the fabrication of the TC device 400, the wafer on which the TC device 400 is fabricated may be flipped, and a BOX region may be etched to allow formation of the silicide layer 406 for the well region (and W terminal 407), forming two separate BOX regions 410 and 412.

The structure of the TC device 400 leverages the back silicide process to double the displacement diffusions so as to increase the control of the depletion region under the plate oxide layer 110. In certain aspects, a shallow n-type implant may be formed between the silicide layer 406 and the region 115 to reduce the contact resistance of the W terminal 407.

Figure 5:
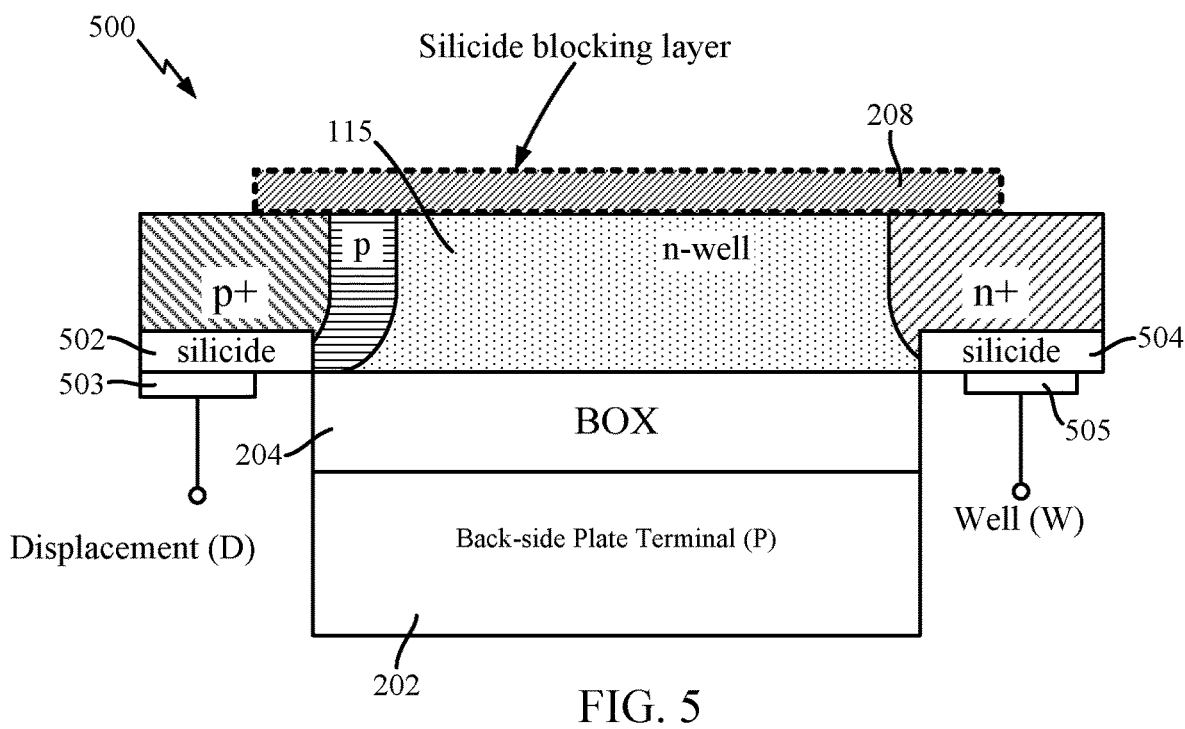
FIG. 5 illustrates an example TC device implemented using a back-gate configuration and using back silicide layers, in accordance with certain aspects of the present disclosure.

FIG. 5 illustrates an example TC device 500 implemented using a back-gate configuration and using back silicide layers, in accordance with certain aspects of the present disclosure. The TC device 500 includes a silicide layer 502 coupled to the D terminal 503, and a silicide layer 504 coupled to the W terminal 505. The silicide layers 502 and 504 are disposed adjacent to the same side of the region 115 as the BOX region 204.

Figure 6A:
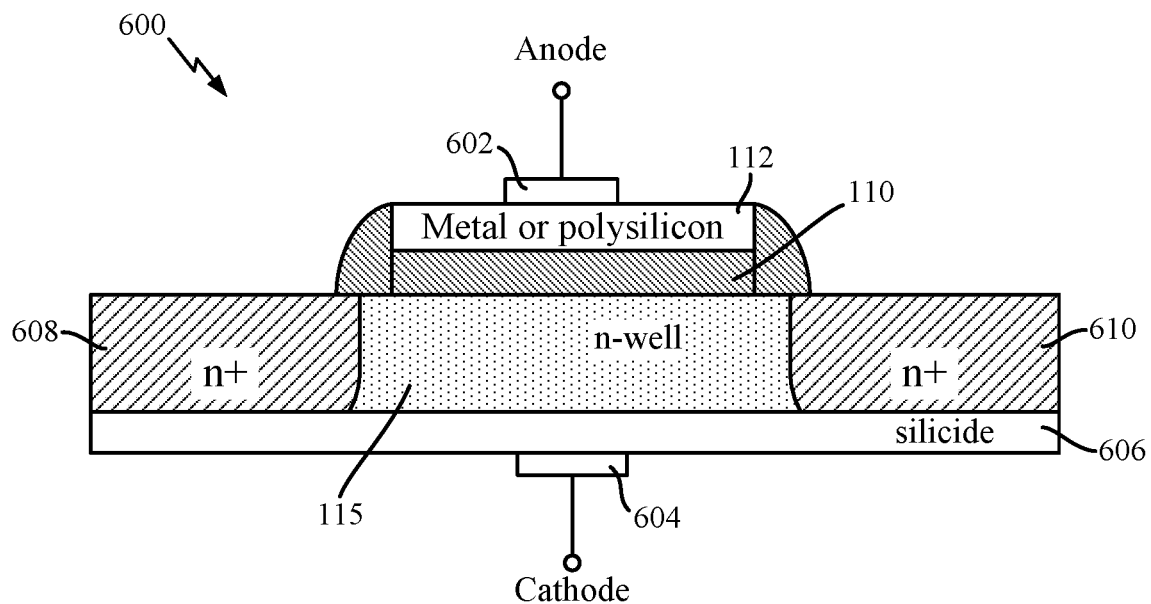
FIGS. 6A and 6B illustrate example varactors using a back silicide layer, in accordance with certain aspects of the present disclosure.
Figure 6B:
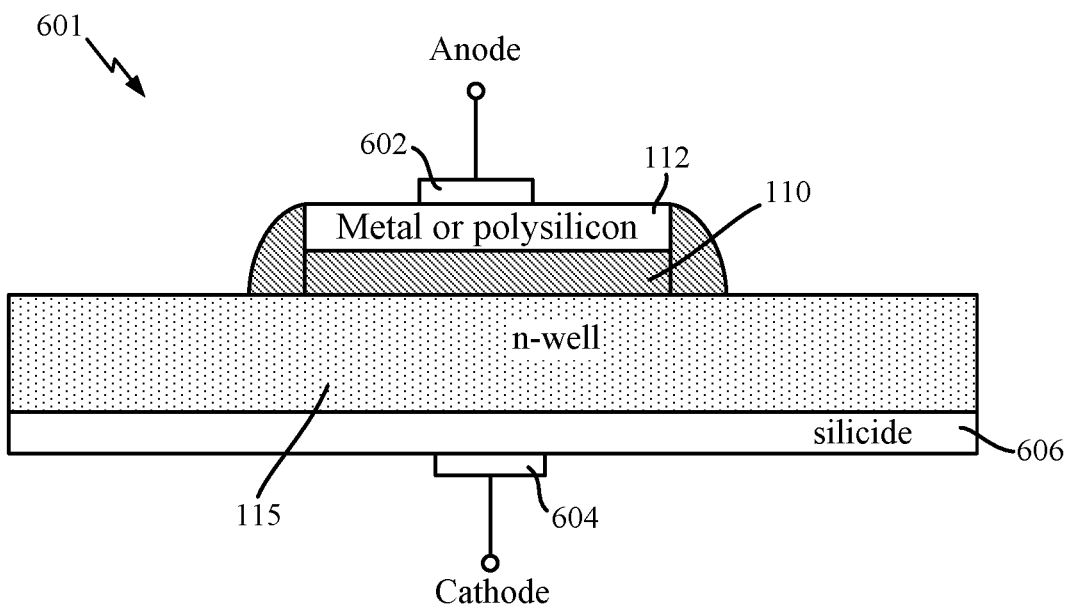

FIGS. 6A and 6B illustrate example varactors 600 and 601 using a back silicide layer, in accordance with certain aspects of the present disclosure. As illustrated, the varactor 600 includes an anode terminal 602 coupled to the non-insulative region 112, and a cathode terminal 604 coupled to a silicide layer 606. The non-insulative region 112 and the silicide layer 606 are disposed adjacent to opposite sides of the region 115 to reduce the parasitic capacitance between the anode terminal 602 and the cathode terminal 604, thereby improving the varactor tuning range. In certain aspects, the varactor 600 may include non-insulative regions 608 and 610 (e.g., highly doped regions), as illustrated in FIG. 6A. As illustrated by the structure of varactor 601 in FIG. 6B, the varactor may be implemented without the non-insulative regions 608 and 610 to further decrease the parasitic capacitance between the anode terminal 602 and the cathode terminal 604.

For both varactors 600 and 601, a shallow implant region, having the same doping type as the region 115, may be disposed between the silicide layer 606 and the region 115 to reduce the contact resistance of the cathode terminal 604. In certain aspects, a series of cathode terminals and silicide layers may be disposed adjacent to the bottom side of the regions 115 to reduce the cathode contact resistance.

Figure 7:
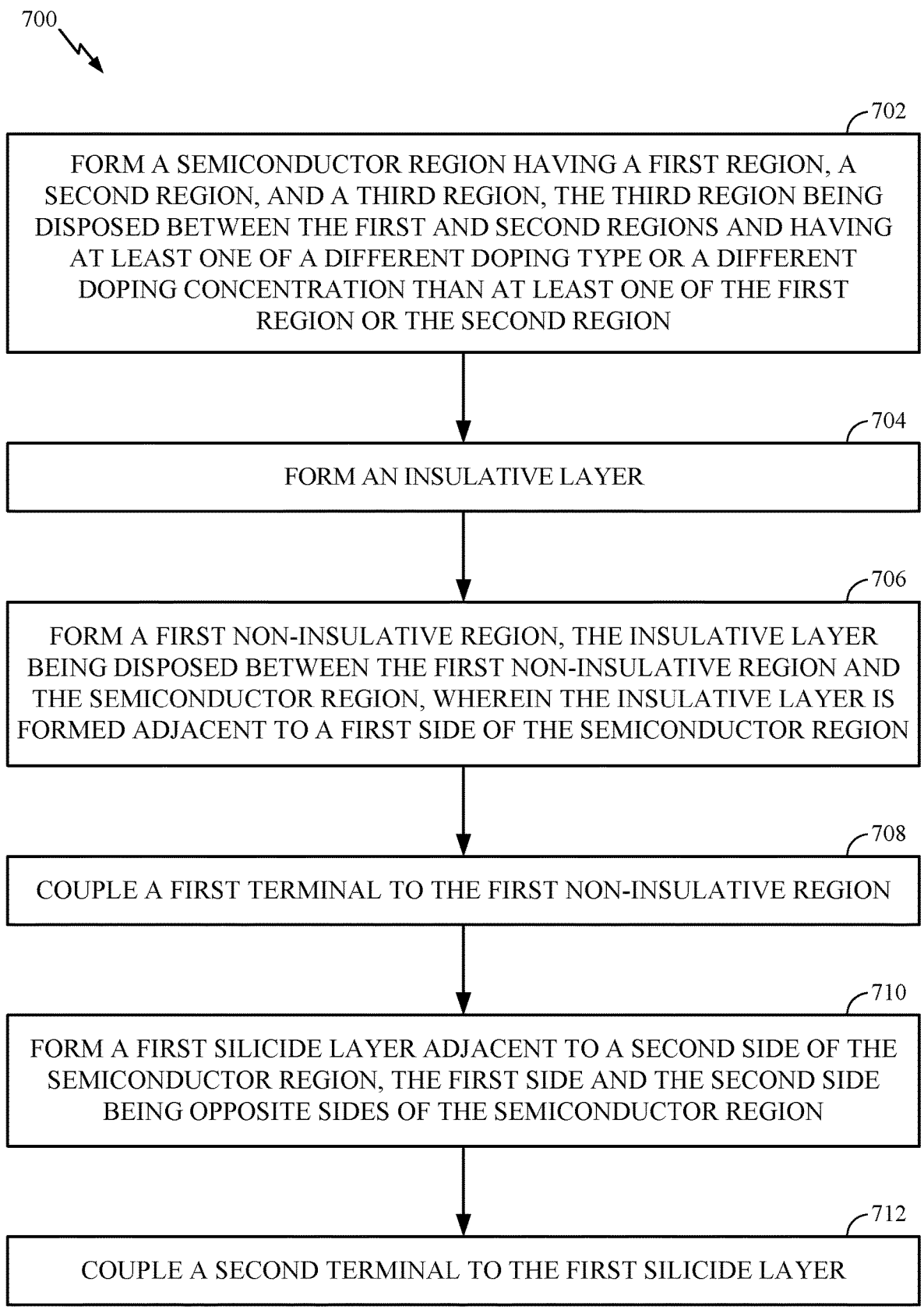
FIG. 7 is a flow diagram of example operations for fabricating a semiconductor variable capacitor having a semiconductor region with regions having different doping concentrations, in accordance with certain aspects of the present disclosure.

FIG. 7 is a flow diagram of example operations 700 for fabricating a semiconductor variable capacitor, in accordance with certain aspects of the present disclosure. The operations 700 may be performed, for example, by a semiconductor processing chamber.

Operations 700 may begin, at block 702, by forming a semiconductor region (e.g., semiconductor region 114) having a first region (e.g., non-insulative region 108), a second region (e.g., non-insulative region 106), and a third region (e.g., region 115), the third region being formed between the first and second regions and having at least one of a different doping type or a different doping concentration than at least one of the first region or the second region. At block 704, an insulative layer (e.g., plate oxide layer 110) is formed, and at block 706, a first non-insulative region (e.g., non-insulative region 112) is formed, the insulative layer being disposed between the first non-insulative region and the semiconductor region, wherein the insulative layer is formed adjacent to a first side of the semiconductor region. At block 708, a first terminal (e.g., P terminal 101) is coupled to the first non-insulative region, and at block 710, a first silicide layer (e.g., silicide layer 302) is formed adjacent to a second side of the semiconductor region, the first side and the second side being opposite sides of the semiconductor region. At block 712, a second terminal (e.g., D terminal 303) is coupled to the first silicide layer.

Figure 8:
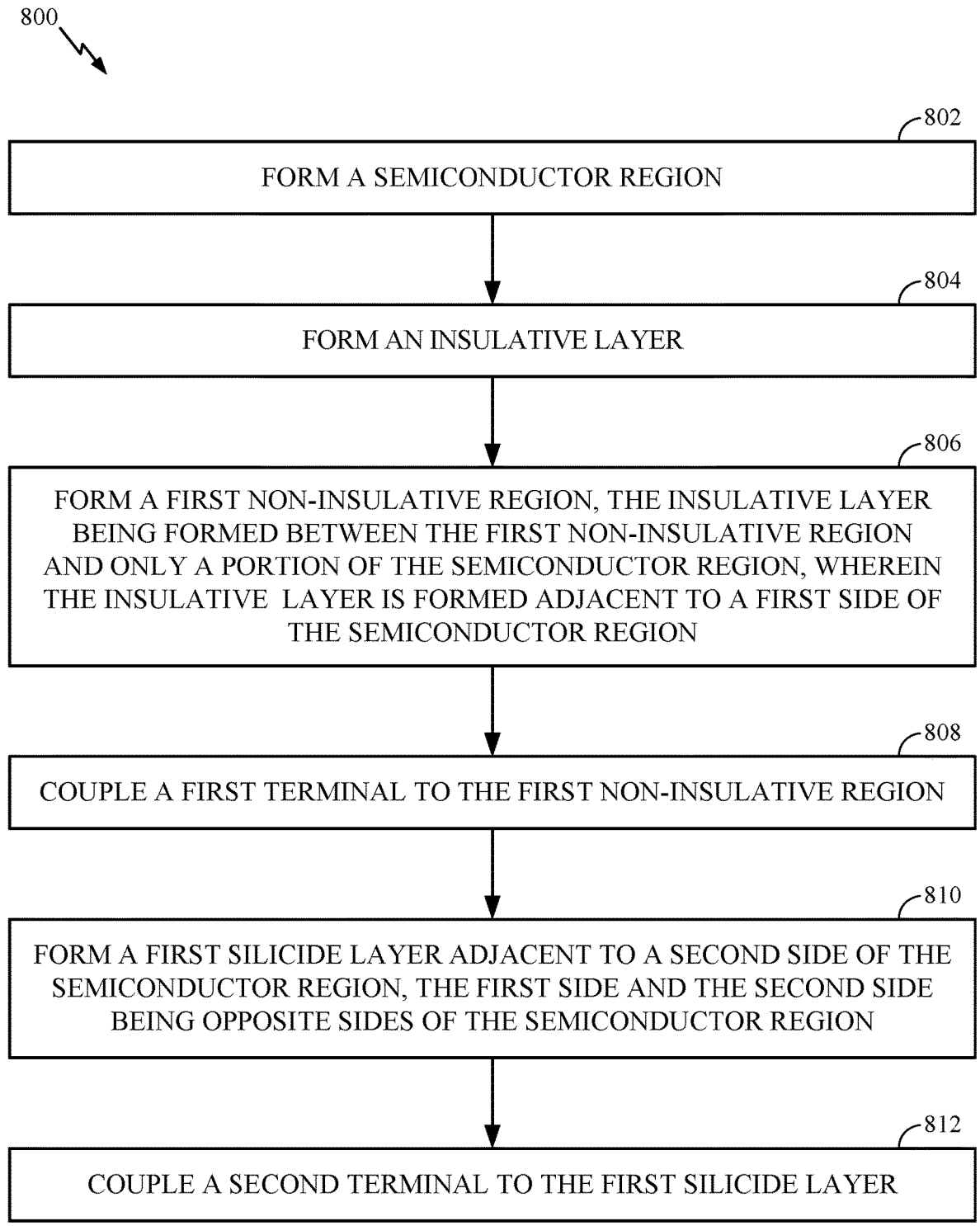
FIG. 8 is a flow diagram of example operations for fabricating a semiconductor variable capacitor having a top gate region disposed above only a portion of a semiconductor region, in accordance with certain aspects of the present disclosure.

FIG. 8 is a flow diagram of example operations 800 for fabricating a semiconductor variable capacitor, in accordance with certain aspects of the present disclosure. The operations 800 may be performed, for example, by a semiconductor processing chamber.

The operations 800 begin, at block 802, by forming a semiconductor region (e.g., semiconductor region 114), and at block 804, by forming an insulative layer (e.g., plate oxide layer 110). At block 806, a first non-insulative region (e.g., non-insulative region 112) is formed, the insulative layer being formed between the first non-insulative region and only a portion of the semiconductor region, wherein the insulative layer is disposed adjacent to a first side (e.g., side 330) of the semiconductor region. At block 808, a first terminal (e.g., anode terminal 602) is coupled to the first non-insulative region, and at block 810, a first silicide layer (e.g., silicide layer 606) is formed adjacent to a second side (e.g., side 332) of the semiconductor region, the first side and the second side being opposite sides of the semiconductor region. At block 812, a second terminal (e.g., cathode terminal 604) is coupled to the first silicide layer.

Figure 9:
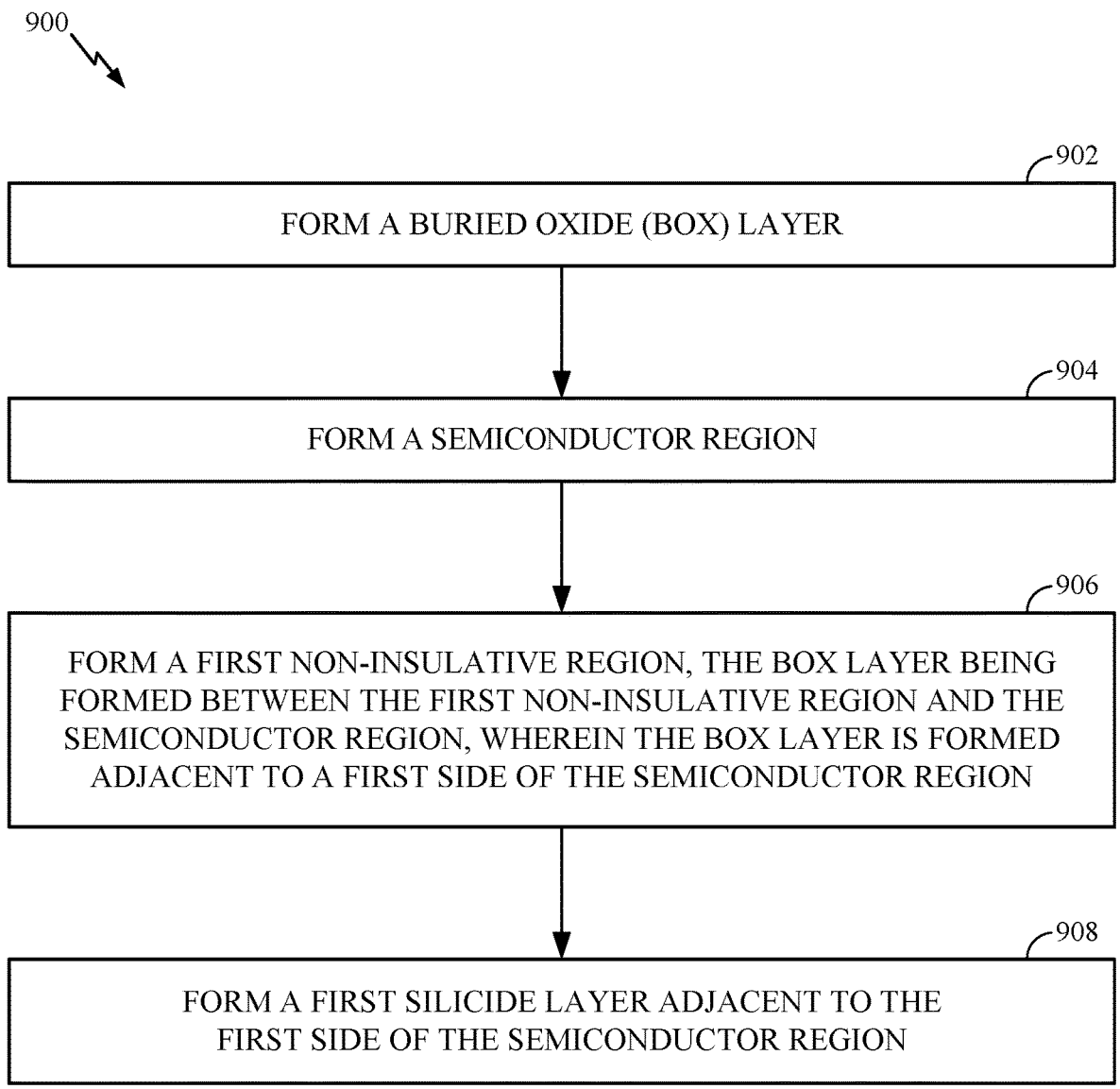
FIG. 9 is a flow diagram of example operations for fabricating a semiconductor variable capacitor implemented using a back-gate configuration, in accordance with certain aspects of the present disclosure.

FIG. 9 is a flow diagram of example operations 900 for fabricating a semiconductor variable capacitor, in accordance with certain aspects of the present disclosure. The operations 900 may be performed, for example, by a semiconductor processing chamber.

The operations 900 begin, at block 902, by forming a BOX region (e.g., BOX region 204), and at block 904, forming a semiconductor region (e.g., semiconductor region 114). At block 906, a first non-insulative region (e.g., non-insulative region 202) is formed, the BOX region being formed between the first non-insulative region and the semiconductor region, wherein the BOX region is formed adjacent to a first side of the semiconductor region. At block 908, a first silicide layer (e.g., silicide layer 502) is formed adjacent to the first side of the semiconductor region.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor comprising:
    a semiconductor region having a first region, a second region, and a third region, the third region being disposed between the first and second regions and having at least one of a different doping type or a different doping concentration than at least one of the first region or the second region;
    an insulative layer;
    a first terminal;
    a first non-insulative region coupled to the first terminal, the insulative layer being disposed between the first non-insulative region and the semiconductor region, wherein the insulative layer is disposed adjacent to an upper side of the semiconductor region, and wherein the insulative layer is configured to electrically isolate the first non-insulative region and the semiconductor region;
    a second terminal; and
    a first silicide layer coupled to the second terminal and disposed adjacent to a lower side of the semiconductor region.

2. The semiconductor variable capacitor of claim 1, wherein the semiconductor variable capacitor is a varactor, wherein the first terminal is an anode of the varactor, and wherein the second terminal is a cathode of the varactor.

3. The semiconductor variable capacitor of claim 1, wherein the first silicide layer is disposed adjacent to the first region.

4. The semiconductor variable capacitor of claim 3, further comprising:
    a third terminal; and
    a second silicide layer coupled to the third terminal and disposed adjacent to the lower side of the semiconductor region.

5. The semiconductor variable capacitor of claim 4, wherein the second silicide layer is disposed adjacent to the second region.

6. The semiconductor variable capacitor of claim 3, wherein the first silicide layer is also disposed adjacent to the third region.

7. The semiconductor variable capacitor of claim 1, further comprising:
    a third terminal;
    a second silicide layer connected to the third terminal and disposed adjacent to the first region and adjacent to the upper side of the semiconductor region;
    a fourth terminal; and
    a third silicide layer connected to the fourth terminal and disposed adjacent to the second region and adjacent to the upper side of the semiconductor region, wherein the first silicide layer is disposed adjacent to the third region.

8. The semiconductor variable capacitor of claim 7, wherein a capacitance between the first terminal and the second terminal is configured to be adjusted by applying a control voltage to at least one of the third terminal or the fourth terminal with respect to the first terminal or the second terminal.

9. The semiconductor variable capacitor of claim 7, further comprising:
    a first buried oxide (BOX) region disposed adjacent to the first region and adjacent to the lower side of the semiconductor region; and
    a second BOX region disposed adjacent to the second region and adjacent to the lower side of the semiconductor region.

10. The semiconductor variable capacitor of claim 7, wherein the first region and the second region have a different doping type than the third region.

11. The semiconductor variable capacitor of claim 1, wherein the semiconductor region comprises a monocrystalline semiconductor.

12. The semiconductor variable capacitor of claim 1, further comprising a BOX region disposed adjacent to the lower side of the semiconductor region.

13. A semiconductor variable capacitor comprising:
    a semiconductor region;
    an insulative layer;
    a first terminal;
    a first non-insulative region coupled to the first terminal, the insulative layer being disposed between the first non-insulative region and only a portion of the semiconductor region, wherein the insulative layer is disposed adjacent to an upper side of the semiconductor region and wherein the insulative layer is configured to electrically isolate the first non-insulative region and the semiconductor region;
    a second terminal; and
    a first silicide layer coupled to the second terminal and disposed adjacent to a lower side of the semiconductor region.

14. The semiconductor variable capacitor of claim 13, wherein the semiconductor variable capacitor is a varactor, wherein the first terminal is an anode of the varactor, and wherein the second terminal is a cathode of the varactor.

15. The semiconductor variable capacitor of claim 13, wherein the semiconductor region comprises:
    a first region;
    a second region; and
    a third region disposed between the first and second regions and having at least one of a different doping type or a different doping concentration than at least one of the first region or the second region.

16. The semiconductor variable capacitor of claim 15, wherein the first silicide layer is disposed adjacent to the first region.

17. The semiconductor variable capacitor of claim 16, further comprising:
    a third terminal; and
    a second silicide layer coupled to the third terminal and disposed adjacent to the lower side of the semiconductor region.

18. The semiconductor variable capacitor of claim 17, wherein a capacitance between the first terminal and the second terminal is configured to be adjusted by applying a control voltage to the third terminal with respect to the first terminal or the second terminal.

19. The semiconductor variable capacitor of claim 17, wherein the second silicide layer is disposed adjacent to the second region.

20. The semiconductor variable capacitor of claim 15, further comprising:
a third terminal;
a second silicide layer coupled to the third terminal and disposed adjacent to the first region and adjacent to the upper side of the semiconductor region;
a fourth terminal; and
a third silicide layer coupled to the fourth terminal and disposed adjacent to the second region and adjacent to the upper side of the semiconductor region, wherein the first silicide layer is disposed adjacent to the third region.

21. The semiconductor variable capacitor of claim 13, wherein the semiconductor region comprises a monocrystalline semiconductor.

22. The semiconductor variable capacitor of claim 13, further comprising a buried oxide (BOX) region disposed adjacent to the lower side of the semiconductor region.

23. A semiconductor variable capacitor comprising:
a semiconductor region;
a buried oxide (BOX) region disposed adjacent to a lower side of the semiconductor region;
a first non-insulative region, the BOX region being disposed between the first non-insulative region and the semiconductor region, wherein the BOX region is disposed adjacent to the lower side of the semiconductor region, wherein the BOX region is configured to electrically isolate the first non-insulative region and the semiconductor region, the first non-insulative region being configured as a first terminal of the semiconductor variable capacitor; and
a first silicide layer disposed adjacent to the lower side of the semiconductor region.

24. The semiconductor variable capacitor of claim 23, wherein the semiconductor region comprises:
a first region;
a second region; and
a third region, the third region being disposed between the first and second regions and having at least one of a different doping type or a different doping concentration than at least one of the first region or the second region.

25. The semiconductor variable capacitor of claim 24, wherein the first silicide layer is disposed adjacent to the first region.

26. The semiconductor variable capacitor of claim 24, further comprising:
a second terminal coupled to the first silicide layer.

27. The semiconductor variable capacitor of claim 26, further comprising:
a third terminal; and
a second silicide layer coupled to the third terminal and disposed adjacent to the lower side of the semiconductor region.

28. The semiconductor variable capacitor of claim 27, wherein a capacitance between the first terminal and the second terminal is configured to be adjusted by applying a control voltage to the third terminal with respect to the first terminal or the second terminal.

29. The semiconductor variable capacitor of claim 27, wherein the second silicide layer is disposed adjacent to the second region.

30. The semiconductor variable capacitor of claim 23, further comprising:
a silicide blocking layer disposed adjacent to an upper side of the semiconductor region.

* * * * *